United States Patent
Hwang

(10) Patent No.: US 12,198,763 B2
(45) Date of Patent: Jan. 14, 2025

(54) MEMORY DEVICE AND OPERATING METHOD FOR PERFORMING A PARTIAL PROGRAM OPERATION

(71) Applicant: SK hynix Inc., Icheon-si (KR)

(72) Inventor: Sung Hyun Hwang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 383 days.

(21) Appl. No.: 17/488,964

(22) Filed: Sep. 29, 2021

(65) Prior Publication Data

US 2022/0328101 A1    Oct. 13, 2022

(30) Foreign Application Priority Data

Apr. 9, 2021    (KR) ......................... 10-2021-0046788

(51) Int. Cl.
| | | |
|---|---|---|
| *G11C 16/10* | (2006.01) | |
| *G11C 16/04* | (2006.01) | |
| *G11C 16/08* | (2006.01) | |
| *G11C 16/16* | (2006.01) | |
| *G11C 16/34* | (2006.01) | |

(52) U.S. Cl.
CPC .......... *G11C 16/10* (2013.01); *G11C 16/0483* (2013.01); *G11C 16/08* (2013.01); *G11C 16/16* (2013.01); *G11C 16/3459* (2013.01)

(58) Field of Classification Search
CPC ..... G11C 16/10; G11C 16/0483; G11C 16/08; G11C 16/16; G11C 16/3459; G11C 16/32; G11C 16/24; G11C 16/30

USPC ................................................... 365/185.22
See application file for complete search history.

(56) References Cited

U.S. PATENT DOCUMENTS 9,361,986 B2 *   6/2016   Chen ..................... G11C 5/063

FOREIGN PATENT DOCUMENTS

| KR | 1020180024216 A | 3/2018 |
|---|---|---|
| KR | 1020190029283 A | 3/2019 |

* cited by examiner

*Primary Examiner* — Anthan Tran
(74) *Attorney, Agent, or Firm* — WILLIAM PARK & ASSOCIATES LTD.

(57) ABSTRACT

A memory device includes a first sub-block including word lines, a second sub-block including word lines, and a peripheral circuit configured to apply voltages to the word lines of the first sub-block and the word lines of the second sub-block. The memory device also includes control logic configured to control the peripheral circuit to perform a partial program operation of storing data in the first sub-block, when a plurality of memory cells included in the first sub-block are erased and a plurality of memory cells included in the second sub-block are programmed. The control logic includes a program operation controller for controlling the peripheral circuit to apply a verify operation to a selected word line of the word lines of the first sub-block and then apply a voltage having a constant level to the word lines of the second sub-block in the partial program operation.

10 Claims, 13 Drawing Sheets

MEMORY DEVICE AND OPERATING METHOD FOR PERFORMING A PARTIAL PROGRAM OPERATION

CROSS-REFERENCE TO RELATED APPLICATION

The present application claims priority under 35 U.S.C. § 119(a) to Korean patent application number 10-2021-0046788 filed on Apr. 9, 2021, in the Korean intellectual Property Office, the entire disclosure of which is incorporated by reference herein.

BACKGROUND

1. Technical Field

The present disclosure generally relates to an electronic device, and more particularly, to a memory device and an operating method thereof.

2. Related Art

A storage device is a device which stores data under the control of a host device such as a computer or a smart phone. The storage device may include a memory device for storing data and a memory controller for controlling the memory device. The memory device is classified as a volatile memory device or a nonvolatile memory device.

A volatile memory device is a memory device in which data is stored only when power is supplied, and the stored data is lost when the supply of power is interrupted. A volatile memory device may include Static Random Access Memory (SRAM), Dynamic Random Access Memory (DRAM), and the like.

A nonvolatile memory device is a memory device in which stored data is not lost when the supply of power is interrupted. A nonvolatile memory device may include Read Only Memory (ROM), Programmable ROM (PROM), Electrically Programmable ROM (EPROM), Electrically Erasable ROM (EEROM), flash memory, and the like.

SUMMARY

Various embodiments provide a memory device for performing an improved partial program operation and an operating method of the memory device.

In accordance with an embodiment of the present disclosure is a memory device including a first sub-block including word lines, a second sub-block including word lines, and a peripheral circuit configured to apply voltages to the word lines of the first sub-block and the word lines of the second sub-block. The memory device also includes control logic configured to control the peripheral circuit to perform a partial program operation of storing data in the first sub-block, when a plurality of memory cells included in the first sub-block are erased and a plurality of memory cells included in the second sub-block are programmed. The control logic includes a program operation controller configured to control the peripheral circuit to apply a verify operation to a selected word line of the word lines of the first sub-block and then apply a voltage having a constant level to the word lines of the second sub-block in the partial program operation.

In accordance with another embodiment of the present disclosure is a method for operating a memory device including a first sub-block and a second sub-block. The method includes, performing a partial erase operation of erasing data stored in the first sub-block and performing a partial program operation of reprogramming the first sub-block in a state in which the second sub-block is programmed. The performing of the partial program operation includes a program step of applying a program voltage to a selected word line of the first sub-block, a verify step of applying a verify voltage to the selected word line, and a precharge step of applying a precharge voltage to the selected word line.

BRIEF DESCRIPTION OF THE DRAWINGS

Example embodiments are described more fully hereinafter with reference to the accompanying drawings; however, they may be embodied in different forms and should not be construed as being limited to the embodiments set forth herein. Rather; these embodiments are provided so that this disclosure will be enabling to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional descriptions disclosed herein are merely illustrative for the purpose of describing embodiments according to the concept of the present disclosure. The embodiments can be implemented in various forms, and should not be construed as being limited to the embodiments set forth herein.

The present disclosure illustrates and describes particular examples. These examples represent a limited number of possible embodiments. The particular examples are not intended to limit or preclude additional embodiments that fall within the scope of the appended claims. The drawings included are illustrated in a fashion where the figures are expanded for a better understanding. In describing the embodiments, descriptions of technologies that are known in the art and are not directly related to the present disclosure are omitted. This is to further clarify the gist of the present disclosure without clutter.

Hereinafter, embodiments of the present disclosure are described in detail with reference to the accompanying drawings in order for those skilled in the art to be able to readily implement the technical spirit of the present disclosure.

Figure 1:
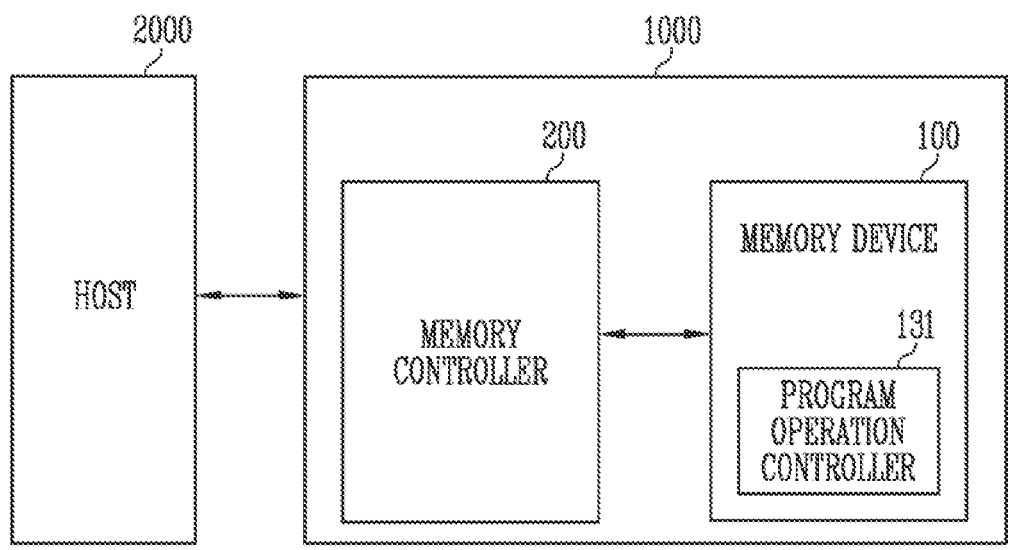
FIG. 1 is a block diagram illustrating a storage device in accordance with an embodiment of the present disclosure.

FIG. 1 is a block diagram illustrating a storage device 1000 in accordance with an embodiment of the present disclosure.

Referring to FIG. 1, the storage device 1000 may include a memory device 100 and a memory controller 200.

The storage device 1000 may be a device for storing data under the control of a host 2000, such as a mobile phone, a smart phone, an MP3 player, a laptop computer, a desktop computer, a game console, a display device, a tablet PC or an in-vehicle infotainment.

The storage device 1000 may be manufactured as any one of various types of storage devices according to a host interface that is a communication scheme with the host 2000, For example, the storage device 1000 may be implemented with any one of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and the like.

The storage device 1000 may be implemented as any one of various kinds of package types. For example, the storage device 1000 may be implemented as any one of a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data or use stored data, The memory device 100 operates under the control of the memory controller 200. Also, the memory device 100 may include a plurality of memory dies, and each of the plurality of memory dies may include a memory cell array including a plurality of memory cells for storing data.

Each of the memory cells may be configured as a Single-Level Cell (SLC) storing one data bit, a Mufti-Level Cell (MLC) storing two data bits, a Triple-Level Cell (TLC) storing three data bits, or a Quad-Level Cell (QLC) storing four data bits.

The memory cell array may include a plurality of memory blocks. Each memory block may include a plurality of memory cells, and one memory block may include a plurality of pages. The page may be a unit for storing data in the memory device 100 or reading data stored in the memory device 100.

The memory device 100 may be implemented using Double Data Rate Synchronous Dynamic Random Access Memory (DDR SDRAM), Low Power Double Data Rate 4 (LPDDR4) SDRAM, Graphics Double Data Rate (DDDR) SRAM, Low Power DDR (LPDDR), Rambus Dynamic Random Access Memory (RDRAM), NAND flash memory, a vertical NAND flash memory, NOR flash memory, Resistive Random Access Memory (RRAM), Phase-Change Random Access Memory (PRAM), Magnetoresistive Random Access Memory (MRAM), Ferroelectric Random Access Memory (FRAM), Spin Transfer Torque Random Access Memory (STT-RAM), or the like. In this specification, for convenience of description, a case where the memory device 100 is implemented with NAND flash memory is assumed and described.

The memory device 100 may receive a command and an address from the memory controller 200, The memory device 100 may access an area selected by the received address in the memory cell array. That the memory device 100 accesses the selected area may mean that the memory device 100 performs an operation corresponding to the received command on the selected area. For example, the memory device 100 may perform a write operation (program operation), a read operation, and an erase operation. The program operation may be an operation in which the memory device 100 records data in the area selected by the address. The read operation may mean an operation in which the memory device 100 reads data from the area selected by the address. The erase operation may mean an operation in which the memory device 100 erases data stored in the area selected by the address.

In accordance with an embodiment of the present disclosure, the memory device 100 may include a program operation controller 131. The program operation controller 131 may control a program operation of storing data received from the host 2000. In particular, the program operation controller 131 may control a voltage level applied to a word line in the program operation. In an embodiment, the program operation controller 131 may control a peripheral circuit to perform a partial program operation of storing data in a partially erased memory block. In particular, the program operation controller 131 may perform the partial program operation even in the case of programmed memory cells at a lower portion of a memory block.

In an embodiment, the program operation controller 131 may control the peripheral circuit to apply a voltage having a constant level to some word lines in the partial program operation. Also, the program operation controller 131 may apply a voltage having a level at which programmed memory cells at a lower portion of a memory block are turned on so as to resolve the effect of negative boosting occurring after a verify operation. The program operation controller 131 turns on the programmed memory cells at the lower portion of the memory block, to boost an upper portion of the memory block by using a voltage of a source line.

The memory controller 200 may control overall operations of the storage device 1000.

When power is applied to the storage device 1000, the memory controller 200 may execute firmware (FW). The FW may include a Host Interface Layer (HIL) which receives a request input from the host 2000 or outputs a response to the host 2000, a Flash Translation Layer (FTL) which manages an operation between an interface of the host 2000 and an interface of the memory device 100, and a Flash Interface Layer (FIL) which provides a command to the memory device 100 or receives a response from the memory device 100.

The memory controller 200 may receive data and a Logical Address (LA) from the host 2000, and translate the LA into a Physical Address (PA) representing an address of memory cells in which data included in the memory device 100 is to be stored. The LA may be a Logical Block Address (LBA), and the PA may be a Physical Block Address (PBA).

The memory controller 200 may control the memory device 100 to perform a program operation, a read operation, an erase operation, or the like in response to a request from the host 2000. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

The memory controller 200 may control the memory device 100 to autonomously perform a program operation, a read operation, or an erase operation regardless of any requests from the host 2000. For example, the memory controller 200 may control the memory device 100 to perform a program operation, a read operation, or an erase operation, which is used to perform a background operation such as wear leveling, garbage collection, or read reclaim.

The host 2000 may communicate with the storage device 1000, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
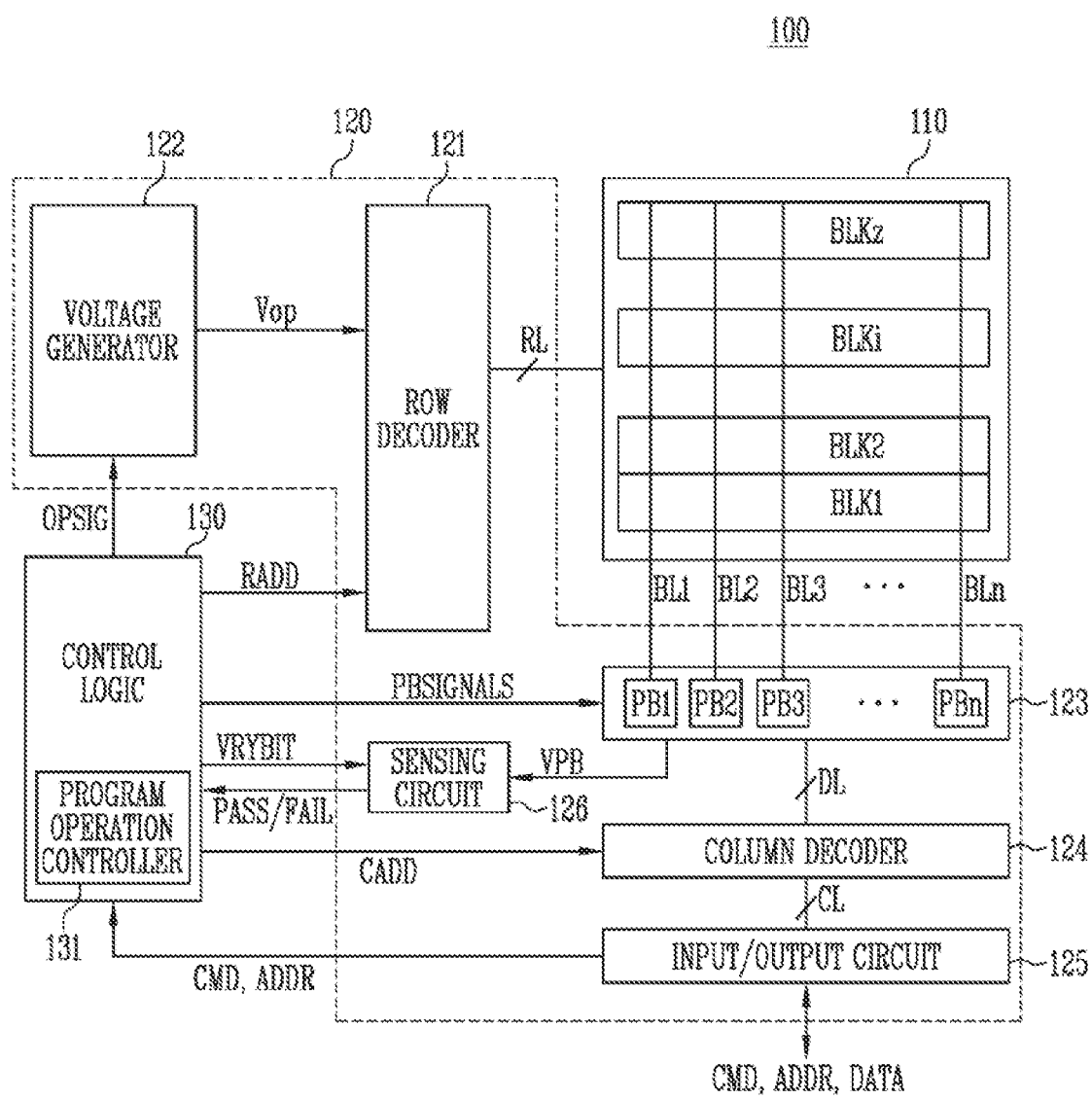
FIG. 2 is a block diagram illustrating a memory device in accordance with an embodiment of the present disclosure.

FIG. 2 is a block diagram illustrating a memory device 100 in accordance with an embodiment of the present disclosure.

Referring to FIG. 2, the memory device 100 may include a memory cell array 110, a peripheral circuit 120, and control logic 130.

The memory cell array 110 includes a plurality of memory blocks BLK1 to BLKz. The plurality of memory blocks BLK1 to BLKz are connected to a row decoder 121 through row lines RL. The row lines RL may include at least one source select line, a plurality of word lines, and at least one drain select line. The plurality of memory blocks BLK1 to BLKz are connected to a page buffer group 123 through bit lines BL1 to BLn. Each of the plurality of memory blocks BLK1 to BLKz includes a plurality of memory cells. In an embodiment, the plurality of memory cells may be nonvolatile memory cells. Memory cells connected to the same word line may be defined as one page. Therefore, one memory block may include a plurality of pages.

Each of the memory cells included in the memory cell array 110 may be configured as a Single-Level Cell (SLC) storing one data bit, a Multi-Level Cell (MLC) storing two data bits, a Triple-Level Cell (TLC) storing three data bits, or a Quadruple-Level Cell (QLC) storing four data bits.

The peripheral circuit 120 may be configured to perform a program operation, a read operation, or an erase operation on a selected area of the memory cell array 110 under the control of the control logic 130. That is, the peripheral circuit 120 may drive the memory cell array 110 under the control of the control logic 130. For example, the peripheral circuit 120 may apply various operating voltages to the row lines RL and the bit lines BL1 to BLn or discharge the applied voltages under the control of the control logic 130.

Specifically, the peripheral circuit 120 may include the row decoder 121, a voltage generator 122, the page buffer group 123, a column decoder 124, an input/output circuit 125, and a sensing circuit 126.

The row decoder 121 may be connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 may operate under the control of the control logic 130. The row decoder 121 may receive a row address RADD from the control logic 130. Specifically, the row decoder 121 may decode the row address RADD. The row decoder 121 may select at least one memory block among the memory blocks BLK1 to BLKz according to the decoded address. Also, the row decoder 121 may select at least one word line of the selected memory block to apply voltages generated by the voltage generator 122 to the at least one word line WL according the decoded address.

For example, in a program operation, the row decoder 121 may apply a program voltage to the selected word line, and apply a program pass voltage having a level lower than that of the program voltage to unselected word lines. In a program verify operation, the row decoder 121 may apply a verify voltage to the selected word line, and apply a verify pass voltage higher than the verify voltage to the unselected word lines. In a read operation, the row decoder 121 may apply a read voltage to the selected word line, and apply a read pass voltage higher than the read voltage to the unselected word lines.

In an embodiment, an erase operation of the memory device 100 may be performed in a memory block unit. In the erase operation, the row decoder 121 may select one memory block according to the decoded address. In the erase operation, the row decoder 121 may apply a ground voltage to word lines connected to the selected memory block.

The voltage generator 122 may operate under the control of the control logic 130. Specifically, the voltage generator 122 may generate a plurality of voltages by using an external power voltage supplied to the memory device 100 under the control of the control logic 130. For example, the voltage generator 122 may generate a program voltage, a verify voltage, a pass voltage, a read voltage, an erased voltage, and the like under the control of the control logic 130, That is, the voltage generator 122 may generate various operating voltages Vop used in program, read, and erase operations in response to an operation signal OPSIG.

In an embodiment, the voltage generator 122 may generate an internal power voltage by regulating the external power voltage. The internal power voltage generated by the voltage generator 122 may be used as an operation voltage of the memory cell array 110.

In an embodiment, the voltage generator 122 may generate a plurality of voltages by using the external power voltage or the internal power voltage. For example, the voltage generator 122 may include a plurality of pumping capacitors for receiving the internal power voltage, and generate the plurality of voltages by selectively activating the plurality of pumping capacitors under the control of the control logic 130. In addition, the plurality of generated voltages may be supplied to the memory cell array 110 by the row decoder 121.

The page buffer group 123 may include first to nth page buffers PB1 to PBn. The first to nth page buffers PB1 to PBn may be connected to the memory cell array 110 respectively through first to nth bit lines BL1 to BLn. Also, the first to nth bit lines BL1 to BLn may operate under the control of the control logic 130. Specifically, the first to nth bit lines BL1 to BLn may operate in response to page buffer control signals PBSIGNALS. For example, the first to nth page buffers PB1 to PBn may temporarily store data received through the first to nth bit lines BL1 to BLn, or sense a voltage or current of the bit lines BL1 to BLn in a read or verify operation.

Specifically, in a program operation, the first to nth page buffers PB1 to PBn may transfer data DATA received through the input/output circuit 125 to selected memory cells through the first to nth bit lines BL1 to BLn, when a program voltage is applied to a selected word line. Memory cells of a selected page may be programmed according to the transferred data DATA, A memory cell connected to a bit line to which a program allow voltage (e.g., a ground voltage) is applied may have an increased threshold voltage, A threshold voltage of a memory cell connected to a bit line to which a program inhibit voltage (e.g., a power voltage) is applied may be maintained.

In a program verify operation, the first to nth page buffers PB1 to PBn may read page data from the selected memory cells through the first to nth bit lines BL1 to BLn.

In a read operation, the first to nth page buffers PB1 to PBn may read data DATA from the memory cells of the selected page through the first to nth bit lines BL1 to BLn, and output the read data DATA to the input/output circuit 125 under the control of the column decoder 124.

In an erase operation, the first to nth page buffers PB1 to PBn may float the first to nth bit lines BL1 to BLn.

The column decoder 124 may communicate data between the input/output circuit 125 and the page buffer group 123 in response to a column address CADD. For example the column decoder 124 may communicate data with the first to nth page buffers PB1 to PBn through data lines DL, or communicate data with the input/output circuit 125 through column lines CL.

The input/output circuit 125 may transfer a command CMD and an address ADDR, which are received from the memory controller 200, to the control logic 130, or exchange data DATA with the column decoder 124.

In a read operation or verify operation, the sensing circuit 126 may generate a reference current in response to an allow bit VRYBIT signal, and output a pass PASS or a fail FAIL signal by comparing a sensing voltage VPB received from the page buffer group 123 and a reference voltage generated by the reference current.

The control logic 130 may control the peripheral circuit 120 by outputting the operation signal OPSIG, the row address RADD, the page buffer control signals PBSIGNALS, and the allow bit VRYBIT in response to the command CMD and the address ADDR. Also, the control logic 130 may determine whether the verify operation has passed or failed in response to the pass or fail signal PASS or FAIL. Also, the control logic 130 may control the page buffer group 123 to temporarily store verify information including the pass or fail signal PASS or FAIL in the page buffer group 123.

In an embodiment of the present disclosure, the control logic 130 may control a program operation of storing data received from the host 2000. In particular, a program operation controller 131 included in the control logic 130 may control a voltage level applied to a word line in the program operation. The program operation controller 131 may control the voltage generator 122 to perform a partial program operation of storing data in a partially erased memory block. The control logic 130 may be implemented as hardware, software, or a combination of hardware and software. For example, the control logic 130 may be a control logic circuit operating in accordance with an algorithm and/or a processor executing control logic code.

In an embodiment, in a program phase, the program operation controller 131 may maintain a constant level of a voltage applied to word lines of a lower sub-block, and apply a voltage having a level lower than that of a program voltage to an unselected word line of an upper sub-block. The lower sub-block and the upper sub-block are distinguished from each other according to a program direction, and the memory device may perform the program operation in a direction from the upper sub-block to the lower sub-block.

In an embodiment, the program operation controller 131 may apply a voltage having a level different from that of a verify voltage to the word lines of the lower sub-block and the unselected word line of the upper sub-block in a verify phase.

In an embodiment, the program operation controller 131 may apply a precharge voltage to word lines of the upper sub-block such that a channel of the upper sub-block is boosted in a precharge phase.

In an embodiment, the program operation controller 131 may maintain, at a constant level, the level of the voltage applied to the word lines of the lower sub-block such that memory cells included in the lower sub-block are turned on in the program phase and the precharge phase. The constant level may be a voltage level at which the memory cells included in the lower sub-block can be turned on.

In an embodiment, the program operation controller 131 may apply, to a dummy word line, a voltage at which memory cells corresponding to the dummy word line are turned off, when the program voltage is applied to a selected word line.

Figure 3:
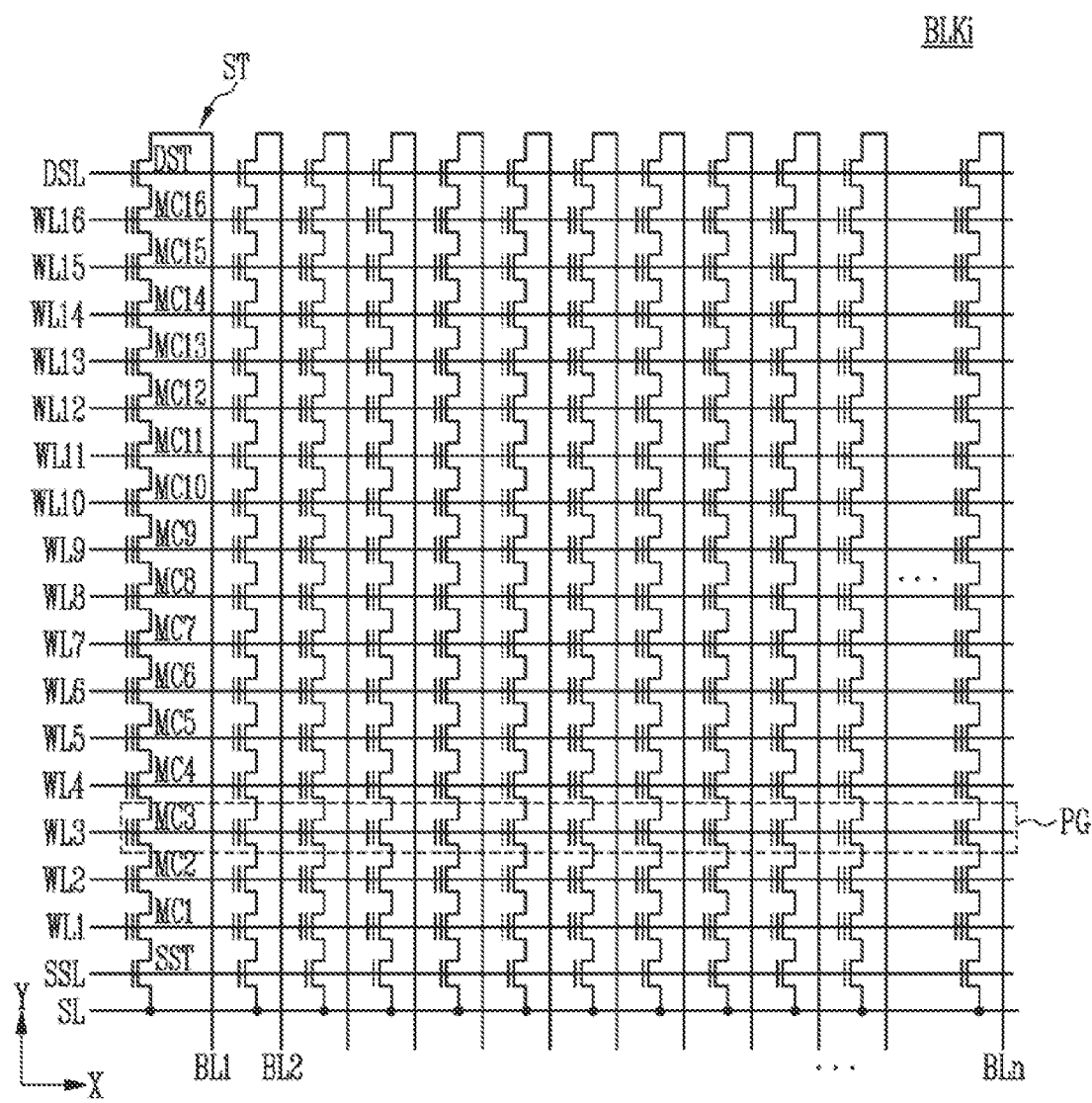
FIG. 3 is a diagram illustrating a memory block in accordance with an embodiment of the present disclosure.

FIG. 3 is a diagram illustrating a memory block BLKi in accordance with an embodiment of the present disclosure.

Referring to FIG. 3, in the memory block BLKi, a plurality of word lines arranged in parallel to each other may be connected between a first select line and a second select line. The first select line may be a source select line SSL, and the second select line may be a drain select line DSL, More specifically, the memory block BLKi may include a plurality of strings ST connected between bit lines BL1 to BLn and a source line SL. The bit lines BL1 to BLn may be respectively connected to the strings ST, and the source line SL may be commonly connected to the strings ST. The strings ST may be configured identically to one another, and therefore, a string ST connected to a first bit line BL1 will be described in detail as an example.

The string ST may include a source select transistor SST, a plurality of memory cells MC1 to MC16, and a drain select transistor DST, which are connected in series to each other between the source line SL and the first bit line BL1. At least one source select transistor SST and at least one drain select transistor DST may be included in one string ST, and a greater number of memory cells than that of the memory cells MC1 to MC16 shown in the drawing may be included in the one string ST.

A source of the source select transistor SST may be connected to the source line SL, and a drain of the drain select transistor DST may be connected to the first bit line BL1, The memory cells MC1 to MC16 may be connected in series between the source select transistor SST and the drain select transistor DST, Gates of source select transistors SST included in different strings ST may be connected to the source select line SSL, and gates of drain select transistors DST included in different strings ST may be connected to the drain select line DSL, Gates of the memory cells MC1 to MC16 may be connected to a plurality of word lines WL1 to WL16, A group of memory cells connected to the same word line among memory cells included in different strings ST may be referred to as a physical page PPG. Therefore, physical pages PPG corresponding to the number of the word lines WL1 to WL16 may be included in the memory block BLKi.

Each of the memory cells may be configured as a Single-Level Cell (SLC) storing one data bit, a Multi-Level Cell (MLC) storing two data bits, a Triple-Level Cell (TLC) storing three data bits, or a Quad-Level Cell (QLC) storing four data bits.

The SLC may store one-bit data. One physical page PG of the SLC may store one logical page (LPG) data. The one LPG data may include data bits of which number corresponding to that of cells included in the one physical page PG.

The MLC, the TLC, and the QLC may store two or lore-bit data. One physical page PG may store two or more LPG data.

Figure 4:
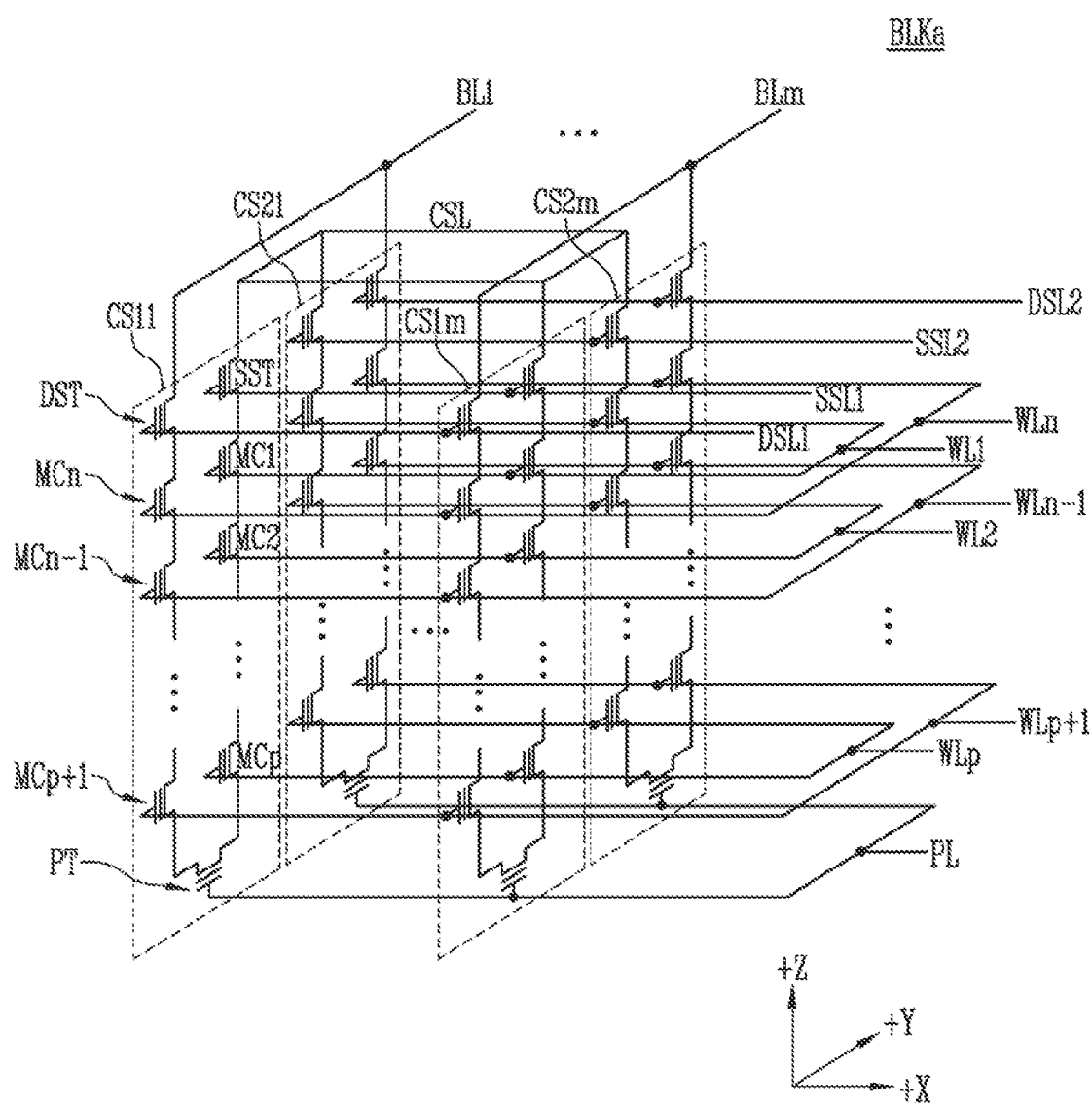
FIG. 4 is a diagram illustrating a memory block in accordance with an embodiment of the present disclosure.

FIG. 4 is a diagram illustrating a memory block in accordance with an embodiment of the present disclosure.

Referring to FIG. 4, a memory block BLKa may include a plurality of cell strings CS11 to CS1m and CS21 to CS2m. In an embodiment, each of the plurality of cell strings CS11 to CS1m and CS21 to CS2m may be formed in a 'U' shape. In the memory block BLKa, m cell strings may be arranged in a row direction (i.e., a +X direction). Meanwhile, although a case of two cell strings arranged in a column direction (i.e., a +Y direction) is illustrated in FIG. 4, this is for convenience of description, and it will be apparent that three or more cell strings may be arranged in the column direction.

Each of the plurality of cell strings CS11 to CS1m and CS21 to CS2m may include at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer; a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is connected between a common source line CSL and memory cells MC1 to MCp.

In an embodiment, the source select transistors of cell strings arranged on the same row are connected to a source select line extending in the row direction, and the source select transistors of cell strings arranged on different rows are connected to different source select lines. Referring to FIG. 4, the source select transistors of the cell strings CS11 to CS1m on a first row are connected to a first source select line SSL1. The source select transistors of the cell strings CS21 to CS2m on a second row are connected to a second source select line SSL2. In another embodiment, the source select transistors of the cell strings CS11 to CS1m and CS21 to CS2m may be commonly connected to one source select line.

The first to nth memory cells MC1 to MCn of each cell string may be connected between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp may be sequentially arranged in the opposite direction of a +Z direction, and be connected in series between the source select transistor SST and the pipe transistor PT. The (p+1)th to nth memory cells MCp+1 to MCn may be sequentially arranged in the +Z direction, and be connected in series between the pipe transistor PT and the drain select transistor DST. The first to pth memory cells MC1 to MCp and the (p+1)th to nth memory cells MCp+1 to MCn are connected through the pipe transistor PT. Gate electrodes of the first to nth memory cells MC1 to MCn of each cell string may be connected to first to nth word lines WL1 to WLn, respectively.

A gate of the pipe transistor PT of each cell string may be connected to a pipe line PL.

The drain select transistor DST of each cell string may be connected between a corresponding bit line and the memory cells MCp+1 to MCn. Cell strings arranged in the row direction may be connected to a drain select line extending in the row direction. The drain select transistors of the cell strings CS11 to CS1m on the first row may be connected to a first drain select line DSL1. The drain select transistors of the cell strings CS21 to CS2m on the second row may be connected to a second drain select line DSL2.

Cell strings arranged in the column direction may be connected to a bit line extending in the column direction. Referring to FIG. 4, the cell strings CS11 and CS21 on a first column may be connected to a first bit line BL1. The cell strings CS1m and CS2m on an mth column may be connected to an mth bit line BLm.

Memory cells connected to the same word line in the cell strings arranged in the row direction may constitute one page. For example, memory cells connected to the first word line WL1 in the cell strings CS11 to CS1m on the first row may constitute one page. Memory cells connected to the first word line WL1 in the cell strings CS21 to CS2m on the second row may constitute another page. As any one of the drain select lines DSL1 and DSL2 is selected, cell strings arranged in one row direction may be selected. As any one of the word lines WL1 to WLn is selected, one page may be selected in the selected cell strings.

In another embodiment, even bit lines and odd bit lines may be provided instead of the first to mth bit lines BL1 to BLm. In addition, even-numbered cell strings among the cell strings CS11 to CS1m or CS21 to CS2m arranged in the row direction may be connected to the even bit lines, respectively, and odd-numbered cell strings among the cell strings CS11 to CS1m or CS21 to CS2m arranged in the row direction may be connected to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKa is improved. On the other hand, the size of the memory block BLKa increases. When the number of dummy memory cells decreases, the size of the memory block BLKa decreases. On the other hand, the reliability of an operation of the memory block BLKa may be deteriorated.

In order to efficiently control the at least one dummy memory cell, the dummy memory cells may have a required threshold voltage. Before or after an erase operation of the memory block BLKa, a program operation may be performed on all or some of the dummy memory cells. When an erase operation is performed after the program operation is performed, the threshold voltage of the dummy memory cells control a voltage applied to the dummy word lines connected to the respective dummy memory cells, so that the dummy memory cells can have the required threshold voltage.

Figure 5:
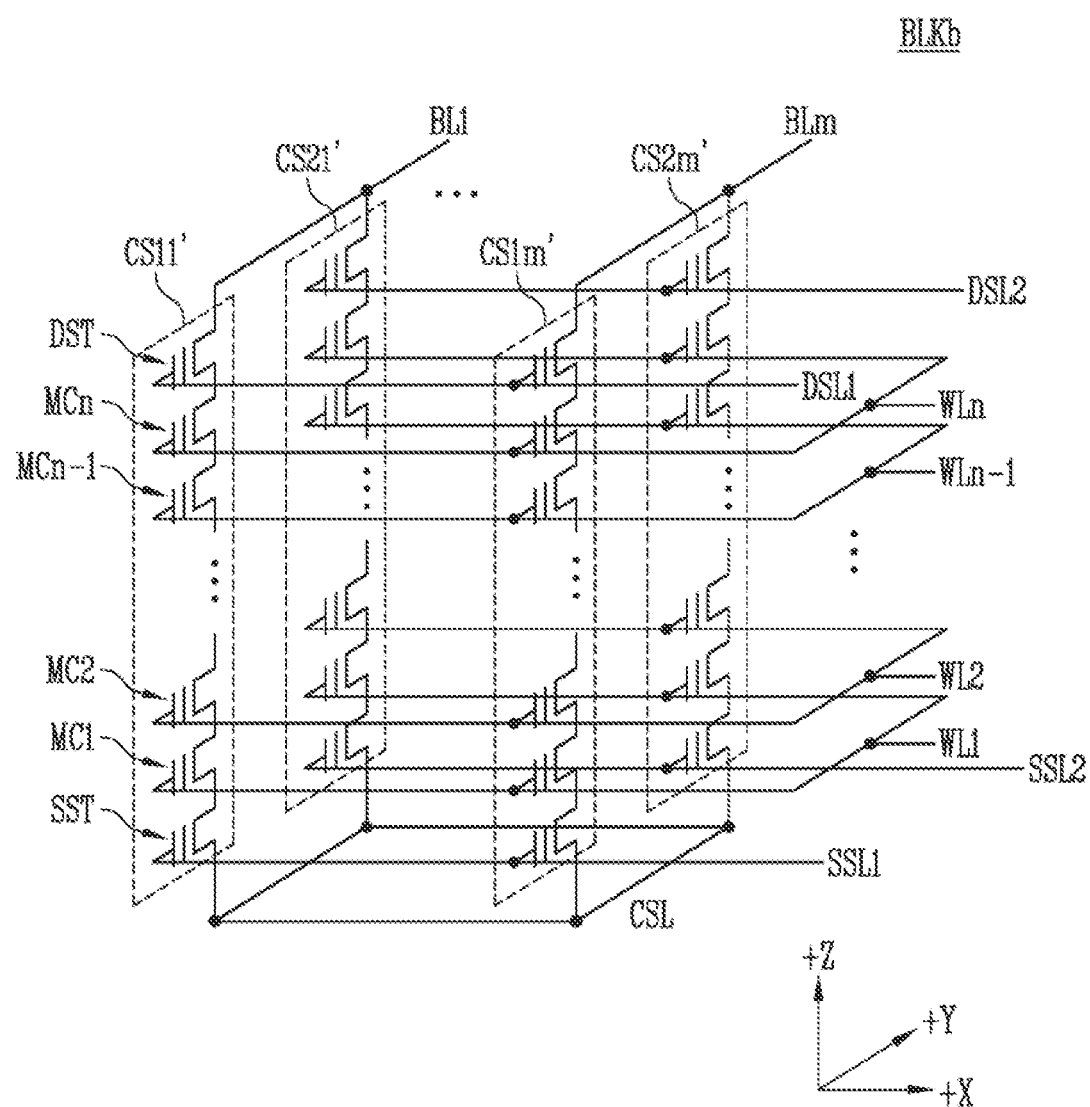
FIG. 5 is a diagram illustrating a memory block in accordance with an embodiment of the present disclosure.

FIG. 5 is a diagram illustrating a memory block in accordance with an embodiment of the present disclosure.

Referring to FIG. 5, a memory block BLKb may include a plurality of cell strings CS11' to CS1m' and CS21' to CS2m'. Each of the plurality of cell strings CS11' to CS1m' and CS21' to CS2m' may extend along the +Z direction. Each of the plurality of cell strings CS11' to CS1m' and CS21' to CS2m' may include at least one source select transistor SST, first to nth memory cells MC1 to MCn, and at least one drain select transistor DST, which are stacked on a substrate (not shown) under the memory block BLKb.

The source select transistor SST of each cell string may be connected between a common source line CSL and the memory cells MC1 to MCn. The source select transistors of cell strings arranged on the same row ay be connected to the same source select line. The source select transistors of the cell strings CS11' to CS1m' arranged on a first row may be connected to a first source select line SSL1. Source select transistors of the cell strings CS21' to CS2m' arranged on a second row may be connected to a second source select line SSL2. In another embodiment, the source select transistors of the cell strings CS11' to CS1m' and CS21' to CS2m' may be commonly connected to one source select line.

The first to nth memory cells MC1 to MCn of each cell string may be connected in series between the source select transistor SST and the drain select transistor DST. Gate electrodes of the first to nth memory cells MC1 to MCn may be connected to first to nth word lines WL1 to WLn, respectively.

The drain select transistor DST of each cell string may be connected between a corresponding bit line and the memory cells MC1 to MCn. The drain select transistors of cell strings arranged in the row direction may be connected to a drain select line extending in the row direction. The drain select transistors of the cell strings CS11' to CS1m' on the first row may be connected to a first drain select line DSL1. The drain select transistors of the cell strings CS21' to CS2m' on the second row may be connected to a second drain select line DSL2.

Consequently, the memory block BLKb of FIG. 5 may have a circuit similar to that of the memory block BLKa of FIG. 4, except that the pipe transistor PT is excluded from each cell string in FIG. 5.

In another embodiment, even bit lines and odd bit lines may be provided instead of the first to mth bit lines BL1 to BLm. In addition, even-numbered cell strings among the cell strings CS11' to CS1m' or CS21' to CS2m' arranged in the row direction may be connected to the even bit lines, respectively, and odd-numbered cell strings among the cell strings CS11' to CS1m' or CS21' to CS2m' arranged in the row direction may be connected to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCn. Alternatively, the at least one dummy memory cell may be provided to decrease an electric field between the drain select transistor DST and the memory cells MC1 to MCn. When the number of dummy memory cells increases, the reliability of an operation of the memory block BLKb is improved. On the other hand, the size of the memory block BLKb is increased. When the number of dummy memory cells decreases, the size of the memory block BLKb decreases. On the other hand, the reliability of an operation of the memory block BLKb may be deteriorated.

In order to efficiently control the at least one dummy memory cell, the dummy memory cells may have a required threshold voltage. Before or after an erase operation of the memory block MAO, a program operation may be performed on all or some of the dummy memory cells. When an erase operation is performed after the program operation is performed, the threshold voltage of the dummy memory cells control a voltage applied to the dummy word lines connected to the respective dummy memory cells, so that the dummy memory cells can have the required threshold voltage.

Figure 6:
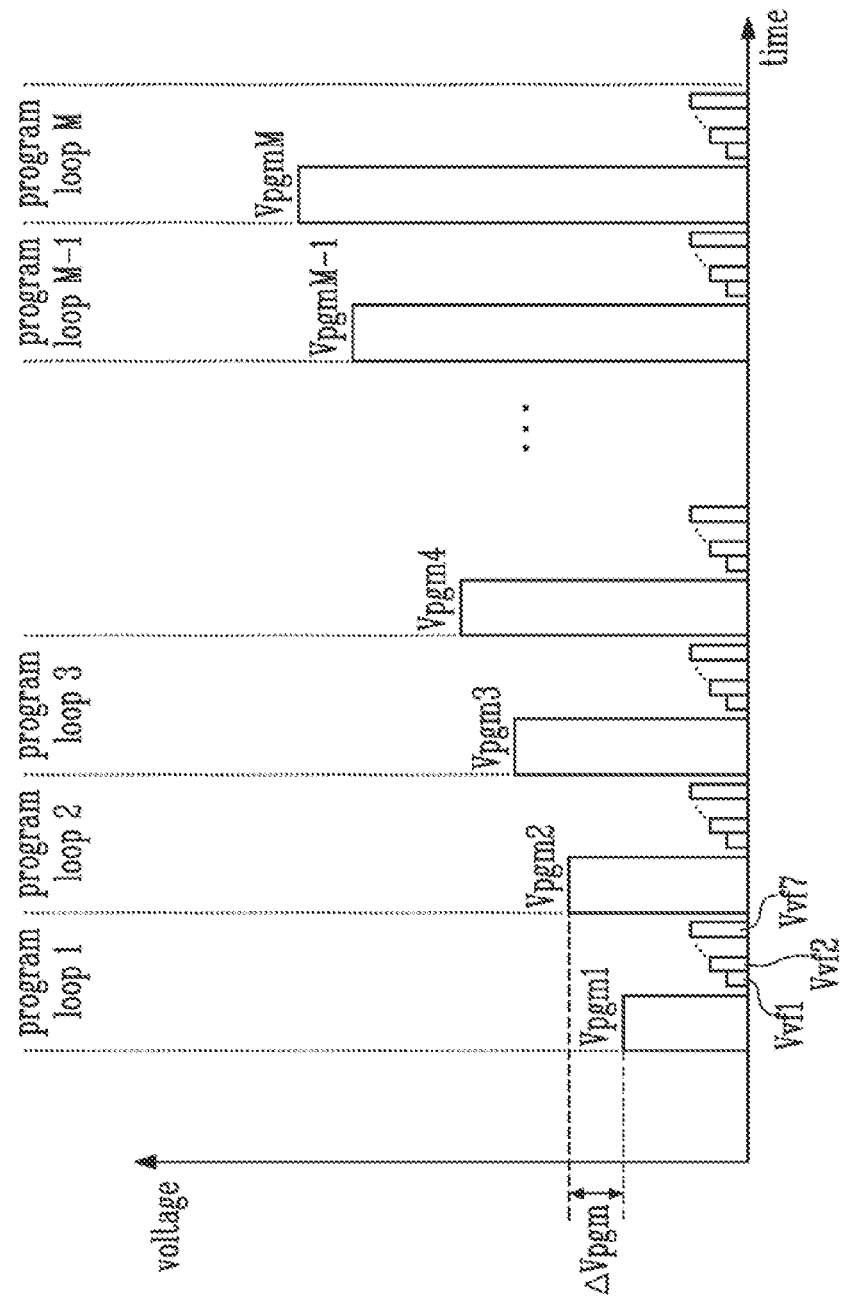
FIG. 6 is a diagram illustrating a voltage applied to a selected word line in a program operation in accordance with an embodiment of the present disclosure.

FIG. 6 is a diagram illustrating a voltage applied to a selected word line in a program operation in accordance with an embodiment of the present disclosure.

Referring to FIG. 6, each program loop may include an operation of applying a program voltage to a selected word line and an operation of applying a verify voltage to the selected word line. The operation of applying the program voltage may be included in a program phase, and the operation of applying the verify voltage may be included in a verify phase. The operation of applying the program voltage may be an operation of increasing a threshold voltage of a memory cell, and the operation of applying the verify voltage may be an operation of checking whether the corresponding memory cell has reached a target program state by determining the threshold voltage. For example, a first program loop may include an operation of applying a first program voltage Vpgm1 and a plurality of verify voltages Vvf1 to Vvf7 to the selected word line. For convenience of description, it is illustrated that seven verify voltages are applied in all program loops. However, the number of verify voltages is not limited thereto, and different verify voltages may be applied.

The program voltage may be increased by a step voltage ΔVpgm as program loops are sequentially performed. This is referred to as an Incremental Step Pulse Program (ISPP) method. For example, a second program voltage Vpgm2 applied to the selected word line in a second program loop may be higher by the step voltage ΔVpgm than the first program voltage Vpgm1, For convenience of description, it is illustrated that the step voltage is fixed. However, the step voltage may be dynamically changed.

A memory cell which reaches the target program state while M program loops are performed may be in a program inhibit state such that the program operation is no longer performed. Although a subsequent program loop is performed, a threshold voltage of the memory cell in the program inhibit state may be maintained. For example, a memory cell which has been completely programmed to a second program state P2 as the target program state may be in the program inhibit state in a third program loop. In an embodiment, a bit line of the memory cell which reaches the target program state may be precharged to a program inhibit voltage. When the bit line is precharged to the program inhibit voltage, a channel of the memory cell may be self-boosted by the program voltage, and the memory cell might not be programmed.

Figure 7:
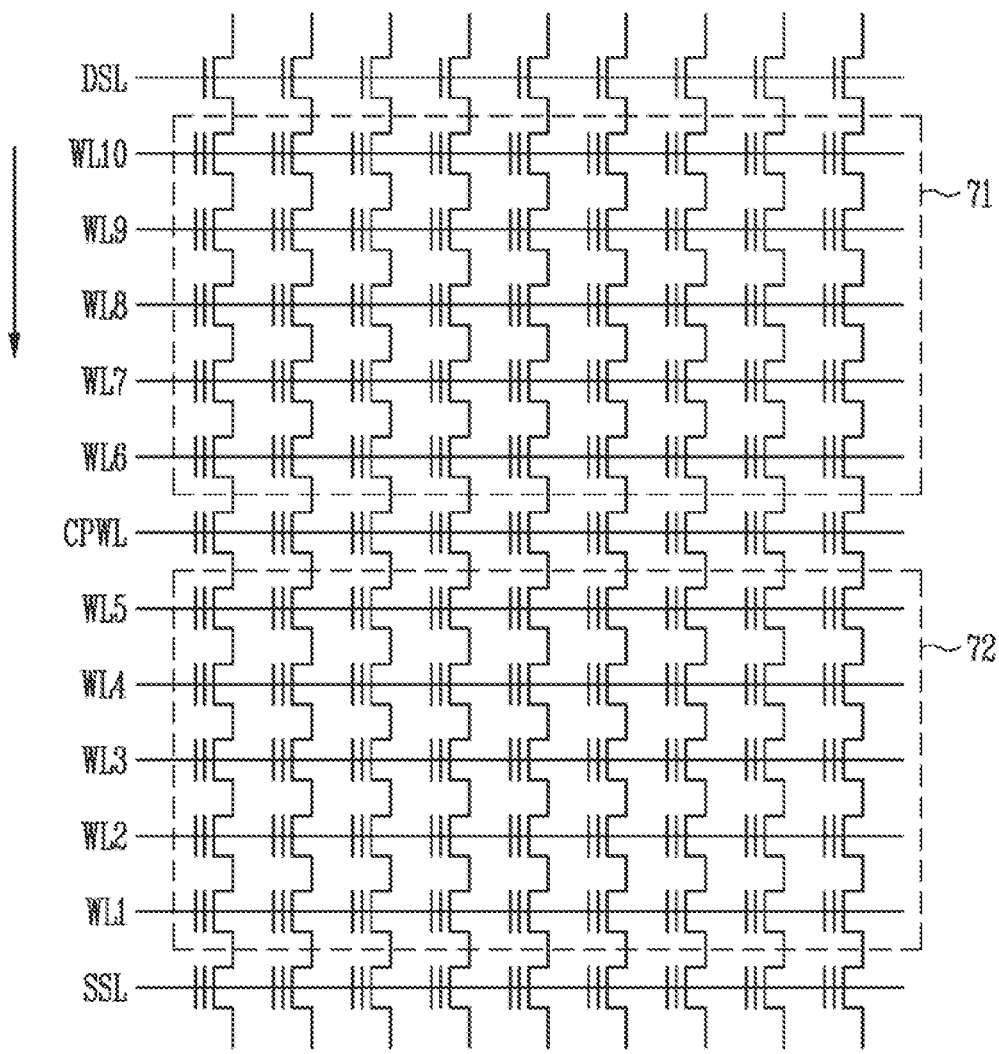
FIG. 7 is a diagram illustrating a sub-block in accordance with an embodiment of the present disclosure.

FIG. 7 is a diagram illustrating a sub-block in accordance with an embodiment of the present disclosure.

Referring to FIG. 7, an embodiment of a memory block 70 including a first sub-block 71 and a second sub-block 72 is illustrated. The memory block 70 may include a select line and a plurality of word lines, and the select line may include a source select line SSL and a drain select line DSL. In addition, upper word lines WL6-WL10 among the plurality of word lines may be included in the first sub-block 71, and lower word lines WL1-WL5 among the plurality of word lines may be included in the second sub-block 72, Meanwhile, the memory block 70 shown in FIG. 7 is exemplarily illustrated. The memory block 70 may include word lines of which number is greater than that of the plurality of word lines shown in FIG. 7.

The memory device 100 may perform a program operation of storing data in the memory block 70. The memory device 100 may perform a partial erase operation of erasing a portion of data stored in the memory block 70. In accordance with an embodiment of the present disclosure, the memory device 100 may perform a partial program operation of storing data in the memory block 70 in which the first sub-block 71 is partially erased. In an embodiment, the second sub-block 72 may be a sub-block in which data is stored. The memory device 100 may sequentially perform the program operation in a direction from an upper word line (e.g., the tenth word line WL10) to a lower word line (e.g., the first word line WL1). In a partial program operation of a storing data in an upper sub-block (e.g., the first sub-block 71) in a state in which the lower sub-block (e.g., the second sub-block 72) is programmed, program disturb may occur, in which a voltage from a source line SL is not transferred up to the upper sub-block. In accordance with an embodiment of the present disclosure, the memory device 100 may control a voltage level applied to a word line of the lower sub-block such that the upper sub-block is boosted in the partial program operation. That is, the memory device 100 may apply a voltage having a level at which memory cells of the lower sub-block are turned on in the partial program operation. The memory device 100 uses a voltage of the source line SL, thereby preventing program disturb occurring due to the lack of a program voltage.

Meanwhile, a dummy word line CPWL is located between the first sub-block 71 and the second sub-block 72, which is connected to the first sub-block 71 and the second sub-block 72 through a bit line. In accordance with an embodiment of the present disclosure, dummy memory cells are turned off, to interrupt a voltage between the source line SL and the first sub-block 71.

Figure 8:
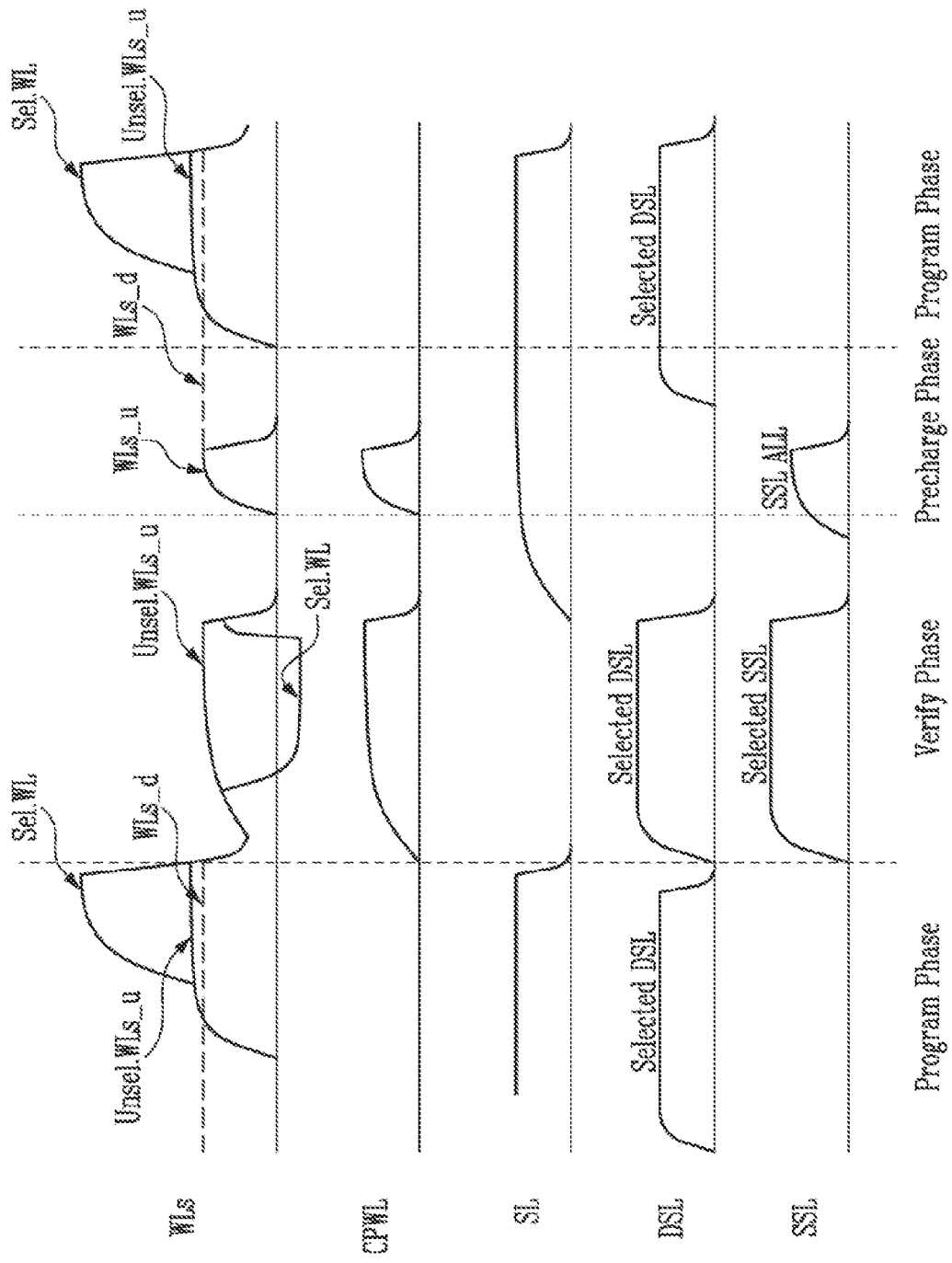
FIG. 8 is a timing diagram illustrating a partial program operation in accordance with an embodiment of the present disclosure.

FIG. 8 is a timing diagram illustrating a partial program operation in accordance with an embodiment of the present disclosure.

Referring to FIG. 8, there are illustrated voltage levels of word lines WLs, a dummy word line CPWL, a source line SL, a drain select line DSL, and a source select line SSL, when a partial program operation is performed. Meanwhile, in FIG. 8, it is assumed that memory cells connected to lower word lines WLs_d are in a program state, memory cells connected to upper word lines WLs_u are in an erased state, and the partial program operation is performed on memory cells connected to any one word line among the upper word lines WLs_u.

Meanwhile, the partial program operation may include a program phase in which a program voltage is applied to a selected word line Sel.WL, a verify phase in which a verify voltage is applied to the selected word line Sel.WL, and a precharge phase in which a precharge voltage is applied to the selected word line Sel.WL. In addition, the program phase, the verify phase, and the precharge phase may form one program loop.

In the program phase, a voltage having a level lower than that of the program voltage applied to the selected word line Sel.WL may be applied to an unselected word line Unsel.WLs_u. In addition, a voltage having a constant level, at which memory cells are turned on, may be applied to the lower word lines WLs_d. In addition, a voltage having a ground (GND) level is applied to the dummy word line CPWL, to interrupt a voltage between the upper word lines WLs_u and the lower word lines WLs_d. In addition, when a voltage is applied to the upper word lines WLs_u, a channel corresponding to the upper word lines WLs_u may be boosted.

In the verify phase, a voltage having the same level may be applied to the unselected word line Unsel.WLs_u among the upper word lines WLs_u and the lower word lines Meanwhile, a verify voltage for verifying the program state may be applied to the selected word line Sel.WL among the upper word lines WLs_u. Different verify voltages may be applied to the selected word line Sel.WL according to a program state to be checked. In addition, there may occur a negative boosting effect in which the level of the channel is changed to become negative according to the level of a verify voltage applied to the selected word line Sel.WL. In accordance with an embodiment of the present disclosure, the memory device 100 may apply a precharge voltage to word lines so as to suppress the negative boosting effect.

In the precharge phase, the precharge voltage may be applied to the word lines WLs such that a voltage from the source line SL is transferred to the selected word line Sel.WL. In addition, the voltage levels of the upper word lines WLs_u and the dummy word line CPWL may be again decreased. However, because the memory cells of the lower word lines WLs_d are in the programmed state, the voltage level applied to the lower word line WLs_d may be maintained for a sufficient time such that the voltage from the source line SL is transferred to the upper word lines. Subsequently, the program phase in which the program voltage is applied may be repeated.

Figure 9:
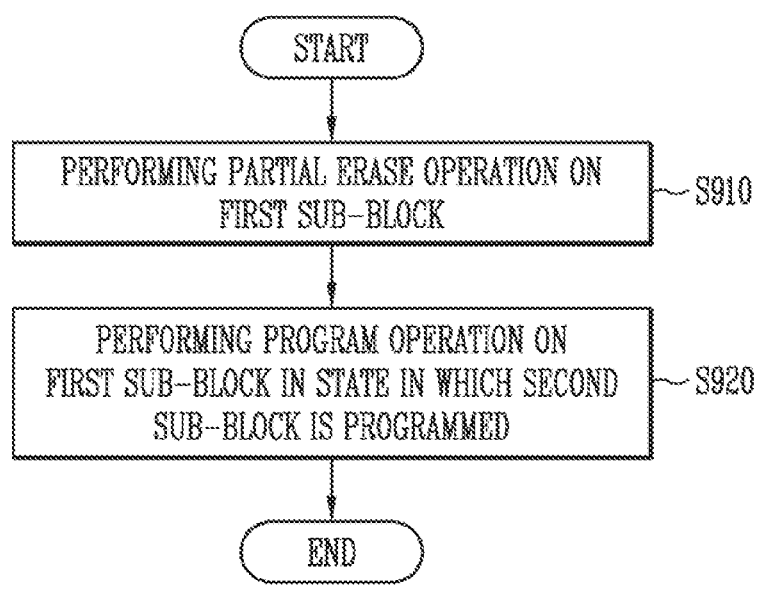
FIG. 9 is a flowchart illustrating an operating method of a memory device in accordance with an embodiment of the present disclosure.

FIG. 9 is a flowchart illustrating an operating method of the memory device 100 in accordance with an embodiment of the present disclosure.

The memory device 100 may perform a partial erase operation of erasing data stored in some memory cells among memory cells included in a memory block which has been completely programmed. For example, the memory device 100 may perform the partial erase operation of erasing data stored in a first sub-block in a state in which the first sub-block and a second sub-block are programmed (S910).

Also, the memory device 100 may perform a partial program operation of performing reprogramming in a state in which only some memory cells among the memory cells included in the memory block are erased as the partial erase operation is performed. That is, the memory device 100 may perform a reprogramming operation of again storing data in the partially erased memory cells. For example, the memory device 100 may perform a program operation on the first sub-block in a state in which the second sub-block is programmed (S920), In an embodiment, the memory device 100 may perform the program operation by using a program step of applying a program voltage to a selected word line of the first sub-block, a verify step of applying a verify voltage to the selected word line, and a precharge step of applying a precharge voltage to the selected word line.

In an embodiment, in the program step, the memory device 100 may apply a voltage having a constant level to word lines of the second sub-block. In addition, in the program step, the memory device 100 may apply a voltage having a level lower than that of the program voltage to an unselected word line of the first sub-block. In the program step, the memory device 100 may apply, to a dummy word line, a voltage having a level equal to or lower than that obtained by adding a channel potential corresponding to the dummy word line and a threshold voltage of the dummy word line.

In an embodiment, in the verify step, the memory device 100 may apply a voltage having a level different from the verify voltage to the word lines of the second sub-block and the unselected word line of the first sub-block.

In an embodiment, in the precharge step, the memory device 100 may apply the precharge voltage to the word lines of the first sub-block such that a channel of the first sub-block is boosted. Also, in the precharge step, the memory device 100 may maintain, at a constant level, the level of the voltage applied to the word lines of the second sub-block such that memory cells included in the second sub-block are turned on.

Meanwhile, the memory device 100 may perform the program operation in a direction from the first sub-block to the second sub-block.

Figure 10:
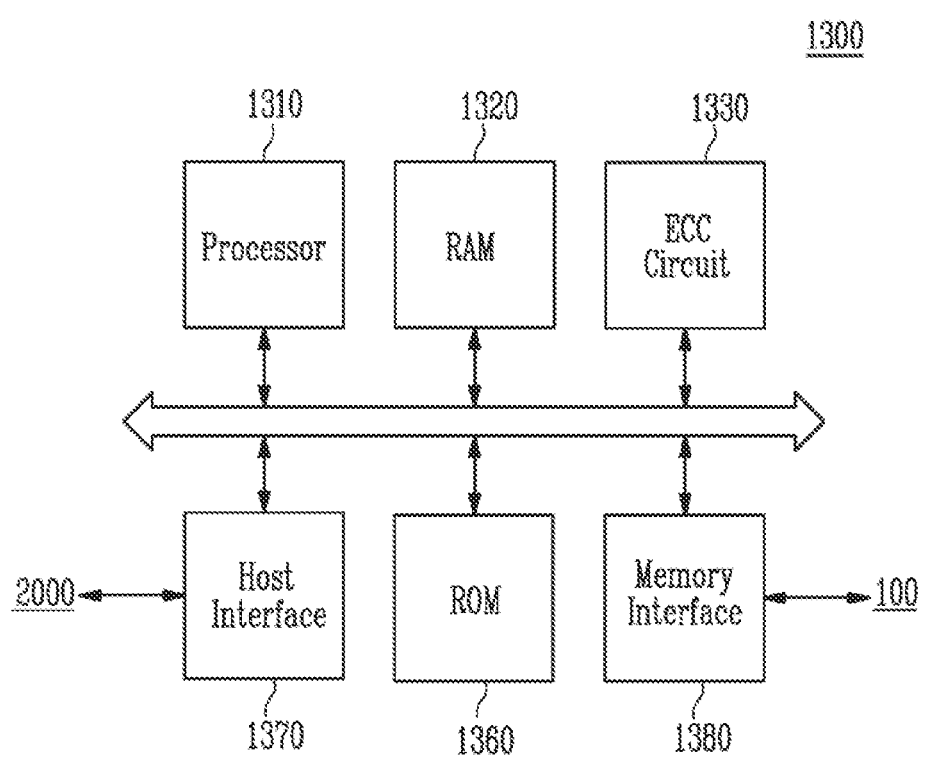
FIG. 10 is a diagram illustrating a memory controller in accordance with an embodiment of the present disclosure.

FIG. 10 is a diagram illustrating a memory controller 1300 in accordance with an embodiment of the present disclosure.

Referring to FIG. 10, the memory controller 1300 may include a processor 1310, RAM 1320, and an ECC circuit 1330, ROM 1360, a host interface 1370, and a memory interface 1380. The memory controller 1300 shown in FIG. 10 may be an embodiment of the memory controller 200 shown in FIG. 1.

The processor 1310 may communicate with the host 2000 by using the host interface 1370, and perform a logical operation to control an operation of the memory controller 1300, For example, the processor 1310 may load a program command, a data file, a data structure, etc., based on a request received from the host 2000 or an external device, and perform various operations or generate a command and an address. For example, the processor 1310 may generate various commands necessary for a program operation, a read operation, an erase operation, a suspend operation, and a parameter setting operation.

Also, the processor 1310 may perform a function of a Flash Translation Layer (FTL). The processor 250 may translate a Logical Block Address (LBA) provided by the host 2000 into a Physical Block Address (PBA) through the FTL. The FTL may receive an LBA as input and translate the LBA into a PBA by using a mapping table. Several address mapping methods of the FTL exist according to mapping units. A representative address mapping method includes a page mapping method, a block mapping method, and a hybrid mapping method.

Also, the processor 1310 may generate a command without any request from the host 2000. For example, the processor 1310 may generate a command for background operations such as operations for wear leveling of the memory device 100 and operations for garbage collection of the memory device 100.

The RAM 1320 may be used as buffer memory, working memory, or cache memory of the processor 1310, Also, the RAM 1320 may store codes and commands, which the processor 1310 executes. The RAM 1320 may store data processed by the processor 1310. Also, the RAM 1320 may be implemented, including Static RAM (SRAM) or Dynamic RAM (DRAM).

The ECC circuit 1330 may detect an error in a program operation or a read operation, and correct the detected error. Specifically, the ECC circuit 1330 may perform an error correction operation according to an Error Correction Code (ECC), Also, the ECC circuit 1330 may perform ECC encoding, based on data to be written to the memory device 100. The data on which the ECC encoding is performed may be transferred to the memory device 100 through the memory interface 1380. Also, the ECC circuit 1330 may perform ECC decoding on data received from the memory device 100 through the memory interface 1380.

The ROM 1360 may be used in a storage unit for storing various information used for an operation of the memory controller 1300. Specifically, the ROM 1360 may include a map table, and physical-to-logical address information and logical-to-physical address information may be stored in the map table. Also, the ROM 1360 may be controlled by the processor 1310.

The host interface 1370 may include a protocol for exchanging data between the host 2000 and the memory controller 1300, Specifically, the host interface 1370 may communicate with the host 2000 through at least one of various interface protocols such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA protocol, a Parallel-ATA protocol, a Small Computer System Interface (SCSI) protocol, an Enhanced Small Disk Interface (ESDI) protocol, an Integrated Drive Electronics (IDE) protocol, and a private protocol.

The memory interface 1380 may communicate with the memory device 100 by using a communication protocol under the control of the processor 1310. Specifically, the memory interface 1380 may communicate a command, an address, and data with the memory device 100 through a channel. For example, the memory interface 1380 may include a NAND interface.

Figure 11:
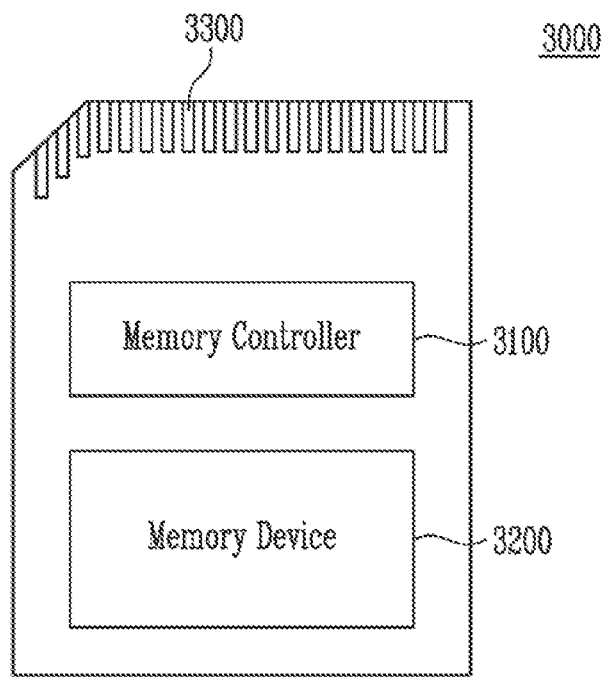
FIG. 11 is a diagram illustrating a memory card system in accordance with an embodiment of the present disclosure.

FIG. 11 is a diagram illustrating a memory card system 3000 in accordance with an embodiment of the present disclosure.

Referring to FIG. 11, the memory card system 3000 includes a memory controller 3100, a memory device 3200, and a connector 3300.

The memory controller 3100 may be connected to the memory device 3200. The memory controller 3100 may access the memory device 3200. For example, the memory controller 3100 may control read, write, erase, and background operations on the memory device 3200. The memory controller 3100 may provide an interface between the memory device 3200 and a host. Also, the memory controller 3100 may drive firmware for controlling the memory device 3200.

For example, the memory controller 3100 may include components such as Random Access Memory (RAM), a processing unit, a host interface, a memory interface, and the error corrector.

The memory controller 3100 may communicate with an external device through the connector 3300. The memory controller 3100 may communicate with the external device (e.g., the host) according to a specific communication protocol. For example, the memory controller 3100 may communicate with the external device through at least one of various communication protocols such as a Universal Serial Bus (USB), a Mufti-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (DATA), a Small Computer System Interface (SCSI), an Enhanced Small Disk Interface (ESDI), an Integrated Drive Electronics (IDE), f rewire, a Universal Flash Storage (UFS), Wi-Fi, Bluetooth, and NVMe.

The memory device 3200 may be implemented with various types of nonvolatile memory such as Electrically Erasable and Programmable ROM (EEPROM), NAND flash memory, NOR flash memory, Phase-change RAM (PRAM), Resistive RAM (ReRAM), Ferroelectric RAM (FRAM), and Spin Torque Transfer magnetic RAM (STT-MRAM).

The memory controller 3100 and the memory device 3200 may be integrated into a single semiconductor device, to constitute a memory card. For example, the memory controller 3100 and the memory device 3200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 12:
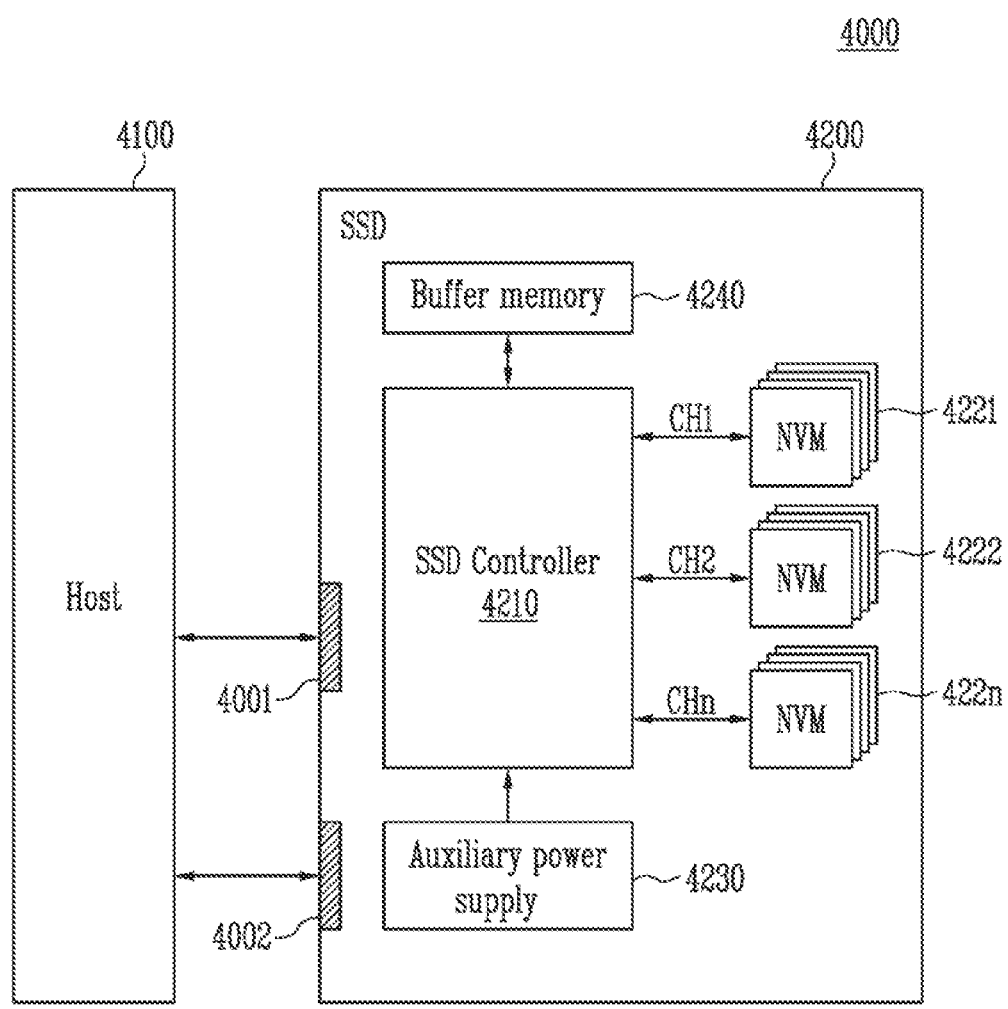
FIG. 12 is a diagram illustrating a Solid State Drive (SSD) in accordance with an embodiment of the present disclosure.

FIG. 12 is a diagram illustrating a Solid State Drive (SSD) system 4000 in accordance with an embodiment of the present disclosure.

Referring to FIG. 12, the SSD system 4000 includes a host 4100 and an SSD 4200. The SSD 4200 exchanges a signal SIG with the host 4100 through a signal connector 4001, and receives power PWR through a power connector 4002. The SSD 4200 includes an SSD controller 4210, a plurality of flash memories 4221 to 422n, an auxiliary power supply 4230, and a buffer memory 4240.

In an embodiment, the SSD controller 4210 may serve as the memory controller 200 described with reference to FIG. 1. The SSD controller 4210 may control the plurality of flash memories 4221 to 422n in response to a signal SIG received from the host 4100. The signal SIG may be a signal based on an interface between the host 4100 and the SSD 4200. For example, the signal SIG may be a signal defined by at least one of interfaces such as a Universal Serial Bus (USB), a Mufti-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (DATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 4230 may be connected to the host 4100 through the power connector 4002. The auxiliary power supply 4230 may receive power PWR input from the host 4100 and charge the power PWR. When the supply of power from the host 4100 is not smooth, the auxiliary power supply 4230 may provide power of the SSD 4200. Exemplarily, the auxiliary power supply 4230 may be located in the SSD 4200, or be located at the outside of the SSD 4200, For example, the auxiliary power supply 4230 may be located on a main board, and provide auxiliary power to the SSD 4200.

The buffer memory 4240 may operate as a buffer memory of the SSD 4200. For example, the buffer memory 4240 may temporarily store data received from the host 4100 or data received from the plurality of flash memories 4221 to 422n, or temporarily store meta data (e.g., a mapping table) of the flash memories 4221 to 422n. The buffer memory 4240 may include volatile memory, such as DRAM, SDRAM, DDR SDRAM, LPDDR SDRAM, and GRAM, or nonvolatile memory, such as FRAM, ReRAM, STT-MRAM, and PRAM, FIG. 13 is a diagram illustrating a user system 5000 in accordance with an embodiment of the present disclosure.

Figure 13:
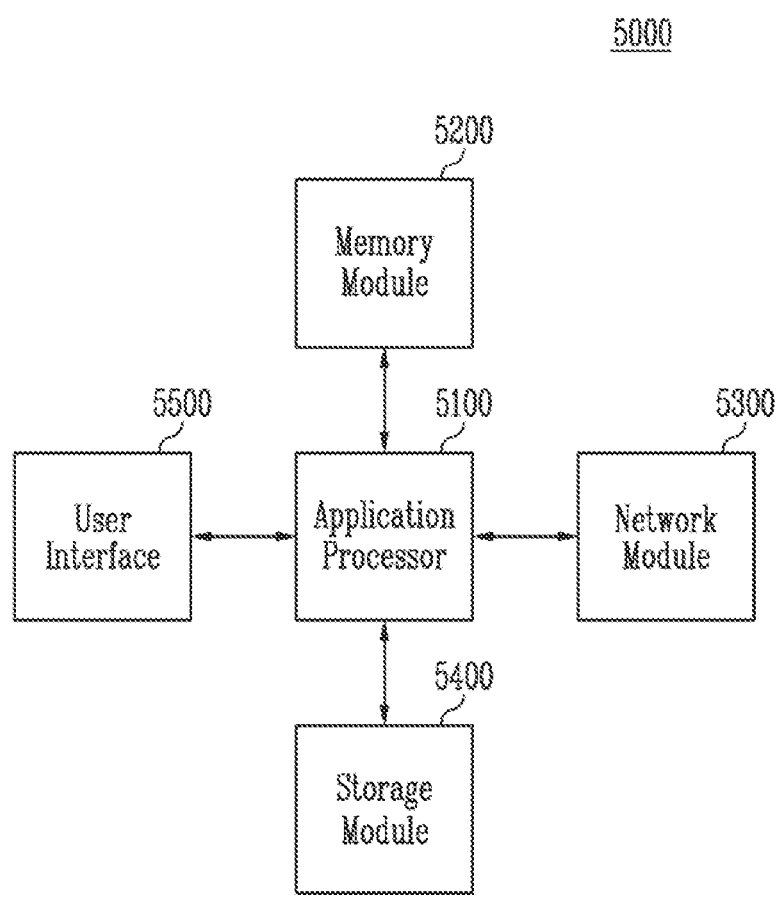
FIG. 13 is a diagram illustrating a user system in accordance with an embodiment of the present disclosure.

Referring to FIG. 13, the user system 5000 includes an application processor 5100, a memory module 5200, a network module 5300, a storage module 5400, and a user interface 5500.

The application processor 5100 may drive components included in the user system 5000, an operating system (OS), a user program, or the like. The application processor 5100 may include controllers for controlling components included in the user system 5000, interfaces, a graphic engine, and the like. The application processor 5100 may be provided as a System-on-Chip (SoC).

The memory module 5200 may operate as a main memory, working memory, buffer memory or cache memory of the user system 5000. The memory module 5200 may include volatile random access memory, such as DRAM, SDRAM, DDR SDRAM, DDR2 SDRM, DDR3 SDRAM, LPDDR SDRAM, LPDDR2 SDRAM, and LPDDR3 SDRAM, or nonvolatile random access memory, such as PRAM, ReRAM, MRAM, and FRAM. The application processor 5100 and the memory module 5200 may be provided as one semiconductor package by being packaged based on a Package on Package (PoP).

The network module 5300 may communicate with external devices. The network module 5300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. The network module 5300 may be included in the application processor 5100.

The storage module 5400 may store data. For example, the storage module 5400 may store data received from the application processor 5100. Alternatively, the storage module 5400 may transmit data stored therein to the application processor 5100. The storage module 5400 may be implemented with a nonvolatile semiconductor memory device including, for example, Phase-change RAM (PRAM), Magnetic RAM (MRAM), Resistive RAM (RRAM), NAND flash, NOR flash, or NAND flash having a three-dimensional structure. The storage module 5400 may be provided as a removable drive such as a memory card of the user system 5000 or an external drive.

The storage module 5400 may include a plurality of nonvolatile memory devices, and the plurality of nonvolatile memory devices may operate identically to the memory device 100 described with reference to FIGS. 1 to 5. The storage module 5400 may operate identically to the storage device 1000 described with reference to FIG. 1.

The user interface 5500 may include interfaces for inputting data or commands to the application processor 5100 or outputting data to an external device. The user interface 5500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 5500 may include user output interfaces such as a Liquid Crystal Display (LCD), an Organic Light Emitting Diode (OLED) display device, an Active Matrix OLED (AMOLED) display device, an LED, a speaker, and a monitor.

In accordance with the present disclosure, there is provided a memory device for performing an improved partial program operation and an operating method of the memory device.

While the present disclosure has been illustrated and described with reference to certain embodiments, it will be understood by those skilled in the art that various changes in form and detail may be applied these embodiments without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all steps may be selectively performed or some of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory device comprising:
   a first sub-block including word lines;
   a second sub-block including word lines;
   a peripheral circuit configured to apply voltages to the word lines of the first sub-block and the word lines of the second sub-block; and
   control logic configured to control the peripheral circuit to perform a partial program operation of storing data in the first sub-block, when a plurality of memory cells included in the first sub-block are erased and a plurality of memory cells included in the second sub-block are programmed,
   wherein, the control logic includes a program operation controller configured to control the peripheral circuit to apply a verify voltage to a selected word line of the word lines of the first sub-block and, after applying the verify voltage to the selected word line, apply a voltage having a constant level to the word lines of the second sub-block in the partial program operation.

2. The memory device of claim 1, wherein the partial program operation includes:
   a program phase in which a program voltage is applied to the selected word line;
   a verify phase in which the verify voltage is applied to the selected word line; and
   a precharge phase in which a precharge voltage is applied to the selected word line.

3. The memory device of claim 2, wherein the program operation controller is configured to:
   maintain the constant level of the voltage applied to the word lines of the second sub-block; and
   apply a voltage having a level lower than that of the program voltage to an unselected word line of the word lines of the first sub-block, in the program phase.

4. The memory device of claim 2, wherein the program operation controller is configured to apply a voltage having a level different from that of the verify voltage to the word lines of the second sub-block and an unselected word line of the word lines of the first sub-block in the verify phase.

5. The memory device of claim 2, wherein the program operation controller is configured to apply the precharge voltage to the word lines of the first sub-block such that a channel of the first sub-block is boosted in the precharge phase.

6. The memory device of claim 2, wherein the program operation controller is configured to maintain, at the constant level, a level of a voltage applied to the word lines of the second sub-block such that the plurality of memory cells included in the second sub-block are turned on in the program phase and the precharge phase.

7. The memory device of claim 1, further comprising a dummy word line located between the first sub-block and the second sub-block, the dummy word line being connected to the first sub-block and the second sub-block through a bit line.

8. The memory device of claim 7, wherein the program operation controller is configured to apply, to the dummy word line, a voltage at which memory cells corresponding to the dummy word line are turned off, when a program voltage is applied to the selected word line.

9. The memory device of claim 1, wherein the peripheral circuit further includes a voltage generator configured to generate a voltage for performing the partial program operation.

10. The memory device of claim 1, wherein the program operation controller is configured to control the peripheral circuit to perform the partial program operation in a direction from the first sub-block to the second sub-block.

* * * * *